US012133423B2

(12) United States Patent
Lee et al.

(10) Patent No.: US 12,133,423 B2
(45) Date of Patent: *Oct. 29, 2024

(54) DISPLAY APPARATUS HAVING PIXEL ELECTRODES ARRANGED ON A PLANARIZATION LAYER

(71) Applicant: Samsung Display Co., Ltd., Yongin-si (KR)

(72) Inventors: Hyeonbum Lee, Yongin-si (KR); Jinwhan Jung, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/097,476

(22) Filed: Jan. 16, 2023

(65) Prior Publication Data

US 2023/0200147 A1  Jun. 22, 2023

Related U.S. Application Data

(63) Continuation of application No. 16/907,277, filed on Jun. 21, 2020, now Pat. No. 11,581,378.

(30) Foreign Application Priority Data

Oct. 30, 2019  (KR) .................. 10-2019-0136907

(51) Int. Cl.
*H10K 59/123* (2023.01)
*H10K 50/86* (2023.01)
(Continued)

(52) U.S. Cl.
CPC ......... *H10K 59/123* (2023.02); *H10K 50/865* (2023.02); *H10K 59/122* (2023.02); *H10K 59/38* (2023.02); *H10K 59/40* (2023.02)

(58) Field of Classification Search
CPC .. H10K 59/123; H10K 50/865; H10K 59/122; H10K 59/38; H10K 59/40
See application file for complete search history.

(56) References Cited

U.S. PATENT DOCUMENTS 9,478,586 B2   10/2016  Lee
9,570,706 B2   2/2017   Yim et al.
(Continued)

FOREIGN PATENT DOCUMENTS

CN   107204355   9/2017
CN   108933155   12/2018
(Continued)

OTHER PUBLICATIONS

Non-Final Office Action mailed Jun. 24, 2022, in U.S. Appl. No. 16/907,277.
(Continued)

*Primary Examiner* — Nduka E Ojeh
(74) *Attorney, Agent, or Firm* — KILE PARK REED & HOUTTEMAN PLLC

(57) ABSTRACT

A display apparatus includes first and second subpixel electrodes on a planarization layer including first and second via holes. The first subpixel includes a first pixel definition layer including a first opening exposing a portion of a first pixel electrode corresponding to a first emission portion. The first pixel electrode is connected to a first pixel circuit through the first via hole. The second subpixel includes a second pixel definition layer including a second opening exposing a portion of a second pixel electrode corresponding to a second emission portion. The second pixel electrode is connected to a second pixel circuit through the second via hole. A second distance defined as a shortest distance from an inner surface of the second opening to the second via hole
(Continued)

is greater than a first distance defined as a shortest distance from an inner surface of the first opening to the first via hole.

20 Claims, 10 Drawing Sheets

(51) Int. Cl.
*H10K 59/122* (2023.01)
*H10K 59/38* (2023.01)
*H10K 59/40* (2023.01)

(56) References Cited

U.S. PATENT DOCUMENTS

| | | |
|---|---|---|
| 10,068,957 B2 | 9/2018 | Kim et al. |
| 10,496,204 B2 | 12/2019 | Heo et al. |
| 10,541,294 B2 | 1/2020 | Hong et al. |
| 11,581,378 B2* | 2/2023 | Lee ............... H10K 59/8792 |
| 2014/0292622 A1* | 10/2014 | Lee ............... G09G 3/3233 345/80 |
| 2016/0124557 A1* | 5/2016 | Choi ............... H10K 59/40 345/173 |
| 2017/0133443 A1* | 5/2017 | Nendai ............ H10K 50/813 |
| 2017/0256597 A1 | 9/2017 | Lee et al. |
| 2018/0218684 A1 | 8/2018 | Choi et al. |
| 2018/0233546 A1 | 8/2018 | Chu et al. |
| 2018/0350886 A1 | 12/2018 | An et al. |
| 2019/0013495 A1 | 1/2019 | Kim et al. |
| 2019/0267440 A1 | 8/2019 | Park et al. |
| 2020/0210006 A1* | 7/2020 | Son ............... H10K 59/12 |
| 2021/0126065 A1 | 4/2021 | Kwon et al. |
| 2021/0398488 A1 | 12/2021 | Park et al. |

FOREIGN PATENT DOCUMENTS

| | | |
|---|---|---|
| KR | 10-2014-0118010 | 10/2014 |
| KR | 10-2015-0084573 | 7/2015 |
| KR | 10-2018-0078669 | 7/2018 |
| KR | 10-2018-0089928 | 8/2018 |

OTHER PUBLICATIONS

Notice of Allowance issued Oct. 6, 2022, in U.S. Appl. No. 16/907,277.

* cited by examiner

DISPLAY APPARATUS HAVING PIXEL ELECTRODES ARRANGED ON A PLANARIZATION LAYER

CROSS-REFERENCE TO RELATED APPLICATION

This application is a Continuation of U.S. patent application Ser. No. 16/907,277, filed on Jun. 21, 2020, which issued as U.S. Pat. No. 11,581,378 on Feb. 14, 2023, which claims priority to and the benefit of Korean Patent Application No. 10-2019-0136907, filed on Oct. 30, 2019, each of which is hereby incorporated by reference for all purposes as if fully set forth herein.

BACKGROUND

Field

One or more embodiments generally relate to display apparatuses, and more particularly, to display apparatuses with improved reliability.

Discussion

From among display apparatuses, organic light emitting display apparatuses have attracted attention as next-generation display apparatuses because they have various advantages, such as a wide viewing angle, excellent contrast, and fast response time. Generally, in an organic light emitting display apparatus, thin film transistors and organic light emitting diodes are formed on a substrate and the organic light emitting diodes emit light by themselves. Such an organic light emitting display apparatus may be used as a display unit of a relatively small product, such as a mobile phone, etc., or may be used as a display unit of a relatively large product, such as a television, etc. To improve light extraction efficiency and secure increased outdoor visibility, an organic light emitting display apparatus may use a polarizer as a film that may selectively transmit or block a vertically or horizontally polarized wave of incident light, or a color filter and a light blocking layer having a polarization function may be used to also improve the flexibility of an organic light emitting display apparatus.

The above information disclosed in this section is only for understanding the background of the inventive concepts, and, therefore, may contain information that does not form prior art.

SUMMARY

In the case of a structure using a color filter and a light blocking layer having a polarization function in a conventional display apparatus, an issue may arise in that a green reflective color band occurs. Accordingly, some aspects seek to provide a display apparatus capable of improving reliability by preventing the occurrence of a green reflective color band.

Additional aspects will be set forth in the detailed description which follows, and, in part, will be apparent from the disclosure, or may be learned by practice of the inventive concepts.

According to some aspects, a display apparatus includes a first planarization layer, a first subpixel, and a second subpixel. The first planarization layer includes a first via hole and a second via hole. The first subpixel includes a first pixel electrode and a first pixel definition layer. The first pixel electrode is arranged on the first planarization layer and is electrically connected to a first pixel circuit through the first via hole. The first subpixel further includes a first emission portion and a first non-emission portion around the first emission portion. The first pixel definition layer is arranged on the first pixel electrode and includes a first opening exposing a portion of the first pixel electrode corresponding to the first emission portion. The second subpixel includes a second pixel electrode and a second pixel definition layer. The second pixel electrode is arranged on the first planarization layer and is electrically connected to a second pixel circuit through the second via hole. The second subpixel further includes a second emission portion and a second non-emission portion around the second emission portion. The second pixel definition layer is arranged on the second pixel electrode and includes a second opening exposing a portion of the second pixel electrode corresponding to the second emission portion. A second distance defined as a shortest distance from an inner surface of the second opening to the second via hole is greater than a first distance defined as a shortest distance from an inner surface of the first opening to the first via hole.

According to some aspects, a display apparatus includes a substrate, a first planarization layer, a first pixel electrode, a second pixel electrode, a third pixel electrode, a pixel definition layer, a first intermediate layer, a second intermediate layer, a third intermediate layer, and an opposite electrode. The substrate includes a first area corresponding to a first emission portion, a second area corresponding to a second emission portion, and a third area corresponding to a third emission portion. The first planarization layer is arranged over the substrate. The first planarization layer includes a first via hole, a second via hole, and a third via hole. The first pixel electrode is arranged on the first planarization layer and is electrically connected to a first pixel circuit through the first via hole. The second pixel electrode is arranged on the first planarization layer and is electrically connected to a second pixel circuit through the second via hole. The third pixel electrode is arranged on the first planarization layer and is electrically connected to a third pixel circuit through the third via hole. The pixel definition layer is arranged on the first pixel electrode, the second pixel electrode, and the third pixel electrode. The pixel definition layer includes a first opening exposing a central portion of the first pixel electrode, a second opening exposing a central portion of the second pixel electrode, and a third opening exposing a central portion of the third pixel electrode. The first intermediate layer is arranged on the first pixel electrode. The second intermediate layer is arranged on the second pixel electrode. The third intermediate layer is arranged on the third pixel electrode. The opposite electrode is arranged on the first intermediate layer, the second intermediate layer, and the third intermediate layer. A second distance defined as a shortest distance from an inner surface of the second opening to the second via hole is greater than a first distance defined as a shortest distance from an inner surface of the first opening to the first via hole.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF SOME EXEMPLARY EMBODIMENTS

Figure 1:
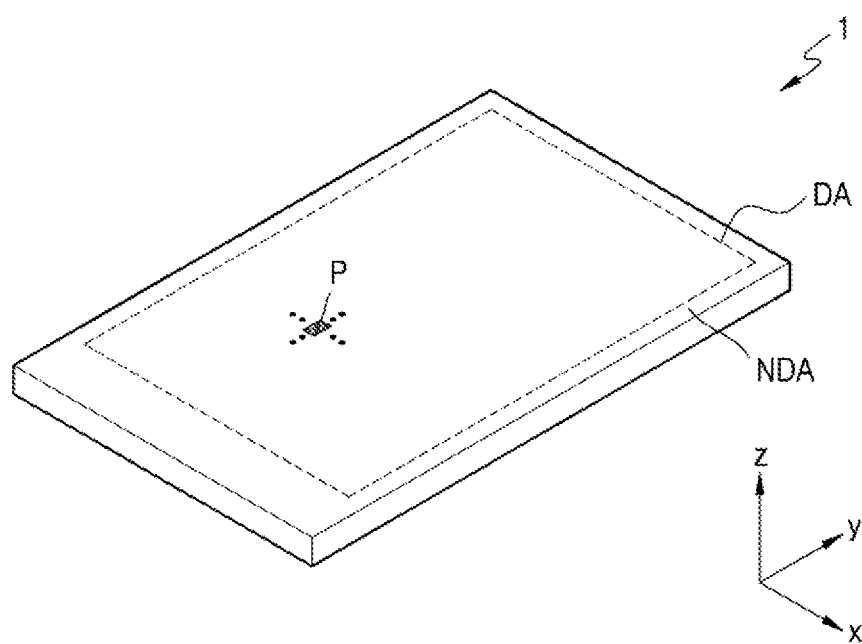
FIG. 1 is a perspective view schematically illustrating a display apparatus according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings FIG. 1 is a perspective view schematically illustrating a display apparatus according to some exemplary embodiments.

Referring to FIG. 1, a display apparatus 1 may include a display area DA that implements (or presents) an image and a non-display area NDA that does not implement an image. The display apparatus 1 may provide an image by using light emitted from a plurality of pixels P arranged in the display area DA, and the non-display area NDA may be an area where no image is displayed.

Hereinafter, although an organic light emitting display apparatus is described as an example of the display apparatus 1 according to an embodiment, the display apparatuses are not limited thereto. In an embodiment, the display apparatus 1 may be an inorganic light emitting display apparatus (or an inorganic electroluminescence display apparatus) or may be a display apparatus, such as a quantum dot light emitting display apparatus, a micro light emitting display apparatus, a nano light emitting display apparatus, an electrophoretic display apparatus, an electrowetting display apparatus, etc. For example, an emission layer of a display element included in the display apparatus 1 may include an organic material, may include an inorganic material, may include quantum dots, may include an organic material and quantum dots, or may include an inorganic material and quantum dots. However, embodiments are not limited to the aforementioned examples.

Although FIG. 1 illustrates the display apparatus 1 having a flat display surface, embodiments are not limited thereto. In an embodiment, the display apparatus 1 may include a three-dimensional display surface or a curved display surface.

When the display apparatus 1 includes a three-dimensional display surface, the display apparatus 1 may include a plurality of display areas indicating different directions and may include, for example, a polygonal columnar display surface. In an embodiment, when the display apparatus 1 includes a curved display surface, the display apparatus 1 may be implemented in various forms, such as flexible, foldable, rollable, and twistable display apparatuses.

Also, as an exemplary embodiment, FIG. 1 illustrates the display apparatus 1 that may be applied to a mobile phone terminal. Although not illustrated, a mobile phone terminal may be constructed by arranging electronic modules, a camera module, a power module, and/or the like mounted on (or connected to) a main board, together with the display apparatus 1 in a bracket/case or the like. The display apparatus 1 according to some exemplary embodiments may be applied to relatively large electronic apparatuses, such as billboards, televisions, monitors, etc., and relatively small and relatively medium electronic apparatuses, such as tablets, notebook computers, car navigation devices, game machines, smart watches, etc.

FIG. 1 illustrates a case where the display area DA of the display apparatus 1 is rectangular; however, in some exemplary embodiments, the shape of the display area DA may also be circular, elliptical, polygonal, such as triangular, pentagonal, etc., or irregular.

Figure 2:
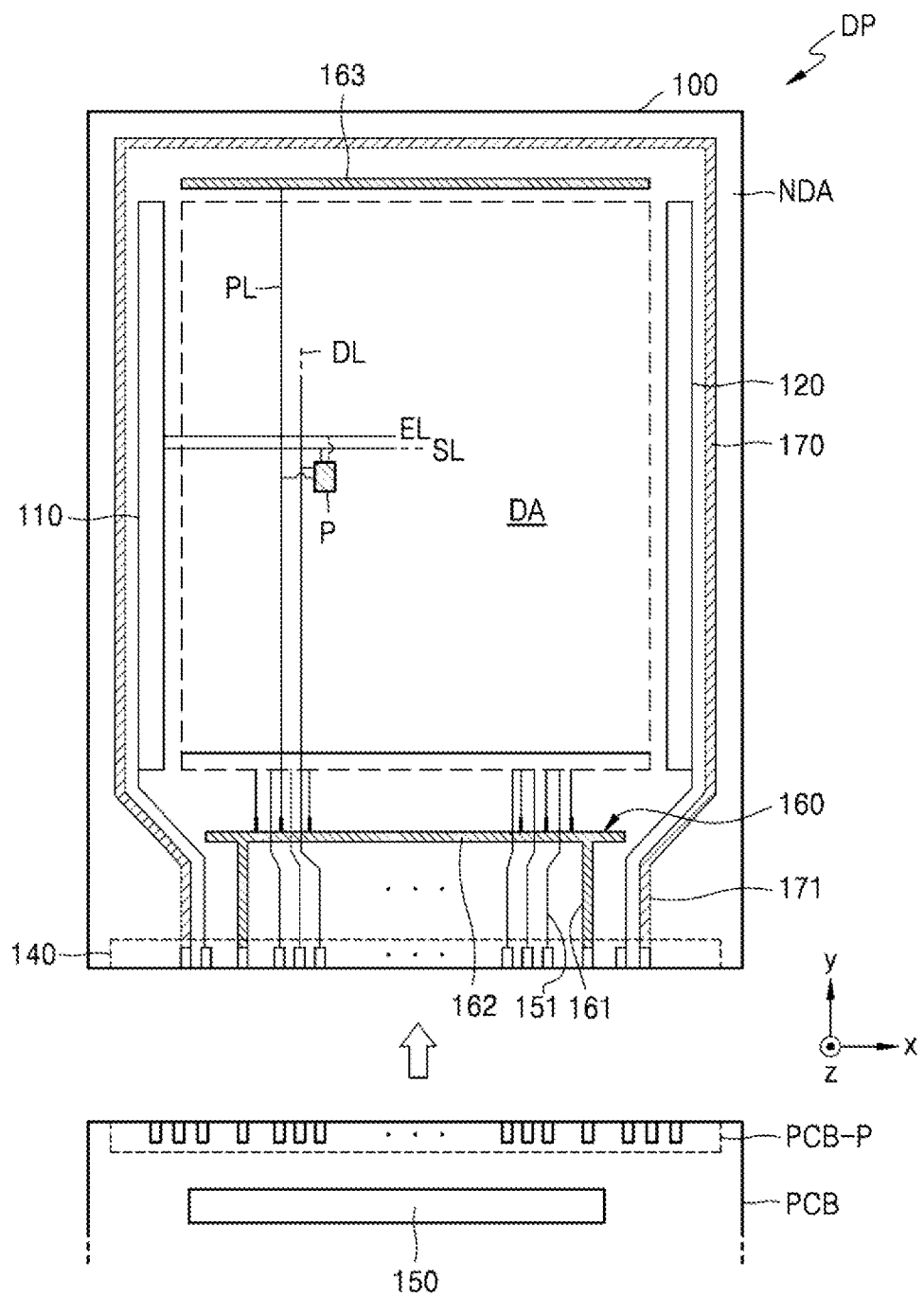
FIG. 2 is a plan view schematically illustrating a portion of a display apparatus according to some exemplary embodiments.

FIG. 2 is a plan view schematically illustrating a portion of a display apparatus according to some exemplary embodiments.

Referring to FIG. 2, a display panel DP of the display apparatus 1 may include a plurality of pixels P arranged in a display area DA. The plurality of pixels P may each include a display element, such as an organic light emitting diode OLED (see, e.g., FIGS. 4 and 5). Each pixel P may emit, for example, red, green, blue, or white light through the organic light emitting diode OLED. As described above, the pixel P may be understood as a pixel emitting light of any one color of red, green, blue, and white, but exemplary embodiments are not limited thereto. The display area DA may be covered with a thin film encapsulation layer TFE (see, e.g., FIG. 7) to be protected from external air and/or moisture.

Each pixel P may be electrically connected to one or more peripheral circuits arranged in a non-display area NDA. A first scan driving circuit 110, a second scan driving circuit 120, a pad portion 140, a data driving circuit 150, a first power supply line 160, and a second power supply line 170 may be arranged in the non-display area NDA.

The first scan driving circuit 110 may provide a scan signal to each pixel P through a scan line SL. The first scan driving circuit 110 may provide an emission control signal to each pixel through an emission control line EL. The second scan driving circuit 120 may be arranged in parallel to the first scan driving circuit 110 with the display area DA therebetween, but exemplary embodiments are not limited thereto. Some of the pixels P arranged in the display area DA may be electrically connected to the first scan driving circuit 110, and other pixels P may be connected to the second scan driving circuit 120. In an embodiment, the second scan driving circuit 120 may be omitted.

The pad portion 140 may be arranged at one side of a substrate 100. The pad portion 140 may be exposed by not being covered by an insulating layer, and may be electrically connected to a printed circuit board PCB. A pad portion PCB-P of the printed circuit board PCB may be electrically connected to the pad portion 140 of the display apparatus 1. The printed circuit board PCB may be configured to transmit power or signals of a controller to the display apparatus 1.

A control signal generated by the controller may be transmitted to each of the first scan driving circuit 110 and the second scan driving circuit 120 through the printed circuit board PCB. The controller may provide a first power voltage ELVDD (see, e.g., FIG. 4) and a second power voltage ELVSS (see, e.g., FIG. 4) to the first power supply line 160 and the second power supply line 170 through a first connection line 161 and a second connection line 171, respectively. The first power voltage ELVDD may be provided to each pixel P through a driving voltage line PL connected to the first power supply line 160, and the second power voltage ELVSS may be provided to an electrode (e.g., an opposite electrode) of each pixel P connected to the second power supply line 170.

The data driving circuit 150 may be electrically connected to a data line DL. A data signal of the data driving circuit 150 may be provided to each pixel P through a connection line 151 connected to the pad portion 140 and a data line DL connected to the connection line 151. FIG. 2 illustrates that the data driving circuit 150 is arranged on the printed circuit board PCB; however, in some exemplary embodiments, the data driving circuit 150 may be arranged on the substrate 100. For example, the data driving circuit 150 may be arranged between the pad portion 140 and the first power supply line 160.

The first power supply line 160 may include a first subline 162 and a second subline 163 extending in parallel in the x direction with the display area DA therebetween, but exemplary embodiments are not limited thereto. The second power supply line 170 may partially surround the display area DA in a loop shape with one side open.

Figure 3:
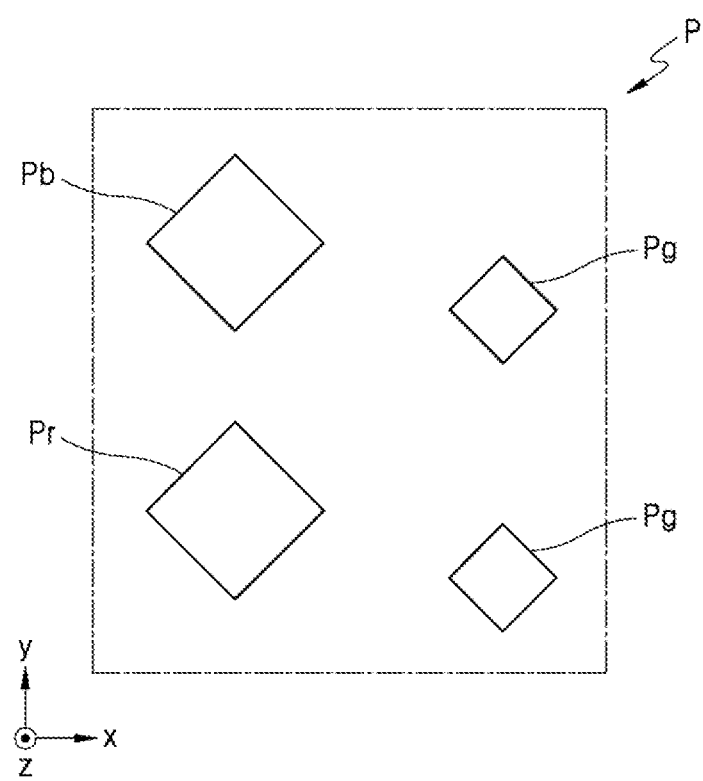
FIG. 3 is a diagram illustrating an arrangement structure of a pixel that may be included in a display apparatus according to some exemplary embodiments.

FIG. 3 is a diagram illustrating an arrangement structure of a pixel that may be included in a display apparatus according to some exemplary embodiments.

Referring to FIG. 3, a pixel of a display apparatus according to an embodiment may include a subpixel Pr emitting red light, a subpixel Pg emitting green light, and a subpixel Pb emitting blue light, and in some exemplary embodiments, it may include two subpixels Pg emitting green light. Although FIG. 3 illustrates an exemplary pentile-type arrangement including subpixels Pr, Pg, and Pb, the subpixels Pr, Pg, and Pb may also be formed in a stripe shape or in one or more various other shapes. Although FIG. 3 illustrates that four subpixels Pr, Pg, and Pb are included in a pixel P, the number of subpixels Pr, Pg, and Pb may be modified and designed according to the resolution of the display area DA.

Figure 4:
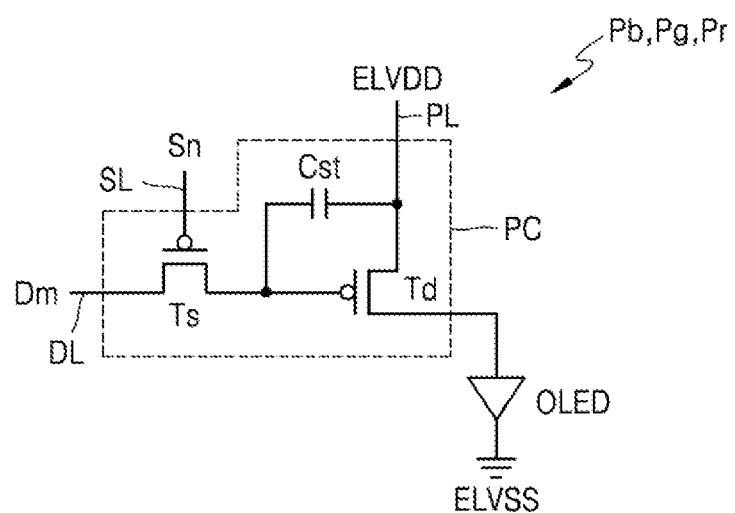
FIGS. 4 and 5 are equivalent circuit diagrams of a subpixel that may be included in a display apparatus according to various exemplary embodiments.
Figure 5:
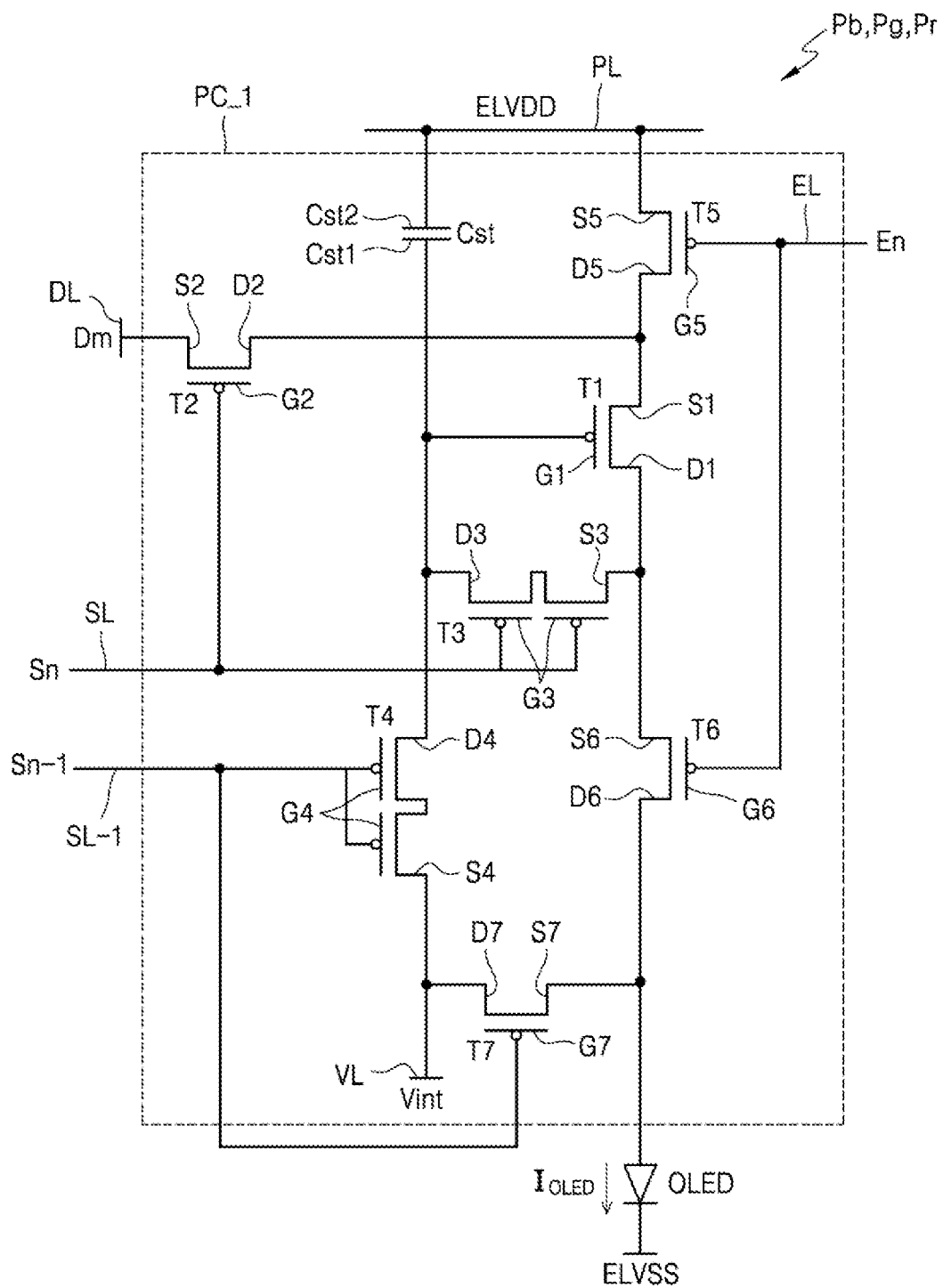

FIGS. 4 and 5 are equivalent circuit diagrams of a subpixel that may be included in a display apparatus according to various exemplary embodiments.

A pixel circuit PC may include a driving thin film transistor Td, a switching thin film transistor Ts, and a storage capacitor Cst. The switching thin film transistor Ts may be connected to the scan line SL and the data line DL, and may be configured to transmit a data signal Dm input through the data line DL to the driving thin film transistor Td according to a scan signal Sn input through the scan line SL.

The storage capacitor Cst may be connected to the switching thin film transistor Ts and the driving voltage line PL, and may store a voltage corresponding to the difference between the voltage received from the switching thin film transistor Ts and the first power voltage ELVDD (or driving voltage) supplied to the driving voltage line PL.

The driving thin film transistor Td may be connected to the driving voltage line PL and the storage capacitor Cst, and may control a driving current flowing from the driving voltage line PL through the organic light emitting diode OLED in response to a voltage value stored in the storage capacitor Cst. The organic light emitting diode OLED may emit light with a certain brightness according to the driving current.

Although FIG. 4 illustrates that the pixel circuit PC includes two thin film transistors and one storage capacitor, embodiments are not limited thereto. For instance, as illustrated in FIG. 5, the pixel circuit PC_1 may include seven thin film transistors and one storage capacitor. Although FIG. 5 illustrates that one storage capacitor is included, the pixel circuit PC_1 may include two or more storage capacitors.

Referring to FIG. 5, subpixels Pb, Pg, and/or Pr may include a pixel circuit PC_1 and an organic light emitting diode OLED connected to the pixel circuit PC_1. The pixel circuit PC_1 may include a plurality of thin film transistors and a storage capacitor. The thin film transistors and the storage capacitor may be connected to signal lines SL, SL−1, EL, and DL, an initialization voltage line VL, and a driving voltage line PL.

Although FIG. 5 illustrates that each subpixel Pb, Pg, and Pr is connected to the signal lines SL, SL−1, EL, and DL, the initialization voltage line VL, and the driving voltage line PL, embodiments are not limited thereto. In some exemplary embodiments, at least one of the signal lines SL, SL−1, EL, and DL, the initialization voltage line VL, the driving voltage line PL, and/or the like may be shared by adjacent pixels/subpixels.

The signal lines may include a scan line SL configured to transmit a scan signal Sn, a previous scan line SL−1 configured to transmit a previous scan signal Sn−1 to a first initialization thin film transistor T4 and a second initialization thin film transistor T7, an emission control line EL configured to transmit an emission control signal En to an operation control thin film transistor T5 and an emission control thin film transistor T6, and a data line DL intersecting with (but disconnected from) the scan line SL and configured to transmit a data signal Dm. The driving voltage line PL may be configured to transmit a driving voltage (e.g., first power voltage ELVDD) to a driving thin film transistor T1, and the initialization voltage line VL may be configured to transmit an initialization voltage Vint for initializing the driving thin film transistor T1 and a pixel electrode of the organic light emitting diode OLED.

A driving gate electrode G1 of the driving thin film transistor T1 may be connected to a lower electrode Cst1 of a storage capacitor Cst, a driving source electrode S1 of the driving thin film transistor T1 may be connected to a driving voltage line PL via the operation control thin film transistor T5, and a driving drain electrode D1 of the driving thin film transistor T1 may be electrically connected to a pixel electrode of the organic light emitting diode OLED via the emission control thin film transistor T6. The driving thin film transistor T1 may receive the data signal Dm according to a switching operation of a switching thin film transistor T2 and supply a driving current $I_{OLED}$ to the organic light emitting diode OLED.

A switching gate electrode G2 of the switching thin film transistor T2 may be connected to the scan line SL, a switching source electrode S2 of the switching thin film transistor T2 may be connected to the data line DL, and a switching drain electrode D2 of the switching thin film transistor T2 may be connected to the driving source electrode S1 of the driving thin film transistor T1 and connected to the driving voltage line PL via the operation control thin film transistor T5. The switching thin film transistor T2 may be turned on according to the scan signal Sn received through the scan line SL to perform a switching operation of transmitting the data signal Dm transmitted to (or via) the data line DL to the driving source electrode S1 of the driving thin film transistor T1.

A compensation gate electrode G3 of a compensation thin film transistor T3 may be connected to the scan line SL, a compensation source electrode S3 of the compensation thin film transistor T3 may be connected to the driving drain electrode D1 of the driving thin film transistor T1 and connected to the pixel electrode of the organic light emitting diode OLED via the emission control thin film transistor T6, and a compensation drain electrode D3 of the compensation thin film transistor T3 may be connected to the lower electrode Cst1 of the storage capacitor Cst, a first initialization drain electrode D4 of the first initialization thin film transistor T4, and the driving gate electrode G1 of the driving thin film transistor T1. The compensation thin film transistor T3 may be turned on according to the scan signal Sn received through the scan line SL to electrically connect the driving gate electrode G1 to the driving drain electrode D1 of the driving thin film transistor T1 to diode-connect the driving thin film transistor T1.

A first initialization gate electrode G4 of the first initialization thin film transistor T4 may be connected to the previous scan line SL−1, a first initialization source electrode S4 of the first initialization thin film transistor T4 may be connected to a second initialization drain electrode D7 of the second initialization thin film transistor T7 and the initialization voltage line VL, and the first initialization drain electrode D4 of the first initialization thin film transistor T4 may be connected to the lower electrode Cst1 of the storage capacitor Cst, the compensation drain electrode D3 of the compensation thin film transistor T3, and the driving gate electrode G1 of the driving thin film transistor T1. The first initialization thin film transistor T4 may be turned on according to the previous scan signal Sn−1 received through the previous scan line SL−1 to perform an initialization operation of initializing the voltage of the driving gate electrode G1 of the driving thin film transistor T1 by transmitting the initialization voltage Vint to the driving gate electrode G1 of the driving thin film transistor T1.

An operation control gate electrode G5 of the operation control thin film transistor T5 may be connected to the emission control line EL, an operation control source electrode S5 of the operation control thin film transistor T5 may be connected to the driving voltage line PL, and an operation control drain electrode D5 of the operation control thin film transistor T5 may be connected to the driving source electrode S1 of the driving thin film transistor T1 and the switching drain electrode D2 of the switching thin film transistor T2.

An emission control gate electrode G6 of the emission control thin film transistor T6 may be connected to the emission control line EL, an emission control source electrode S6 of the emission control thin film transistor T6 may be connected to the driving drain electrode D1 of the driving thin film transistor T1 and the compensation source electrode S3 of the compensation thin film transistor T3, and an emission control drain electrode D6 of the emission control thin film transistor T6 may be electrically connected to a second initialization source electrode S7 of the second initialization thin film transistor T7 and the pixel electrode of the organic light emitting diode OLED.

The operation control thin film transistor T5 and the emission control thin film transistor T6 may be simultaneously turned on according to the emission control signal En received through the emission control line EL such that the driving voltage (e.g., the first power voltage ELVDD) may be transmitted to the organic light emitting diode OLED, and thus, the driving current $I_{OLED}$ may flow through the organic light emitting diode OLED.

A second initialization gate electrode G7 of the second initialization thin film transistor T7 may be connected to the previous scan line SL−1, the second initialization source electrode S7 of the second initialization thin film transistor T7 may be connected to the emission control drain electrode D6 of the emission control thin film transistor T6 and the pixel electrode of the organic light emitting diode OLED, and the second initialization drain electrode D7 of the second initialization thin film transistor T7 may be connected to the first initialization source electrode S4 of the first initialization thin film transistor T4 and the initialization voltage line VL. The second initialization thin film transistor T7 may be turned on according to the previous scan signal Sn−1 received through the previous scan line SL−1 to initialize the pixel electrode of the organic light emitting diode OLED.

Although FIG. 5 illustrates a case where the first initialization thin film transistor T4 and the second initialization thin film transistor T7 are connected to the previous scan line SL−1, embodiments are not limited thereto. In some exemplary embodiments, the first initialization thin film transistor T4 may be connected to the previous scan line SL−1 to be driven according to the previous scan signal Sn−1, and the second initialization thin film transistor T7 may be connected to a separate signal line (e.g., a subsequent scan line) to be driven according to a signal transmitted to the separate signal line.

An upper electrode Cst2 of the storage capacitor Cst may be connected to the driving voltage line PL, and an opposite electrode of the organic light emitting diode OLED may be connected to a common voltage (e.g., the second power voltage ELVSS). Accordingly, the organic light emitting diode OLED may receive the driving current $I_{OLED}$ from the driving thin film transistor T1 to emit light to display an image.

Although FIG. 5 illustrates that the compensation thin film transistor T3 and the first initialization thin film transistor T4 have a dual gate electrode structure, the compensation thin film transistor T3 and the first initialization thin film transistor T4 may have another structure, such as a single gate electrode structure.

Figure 6:
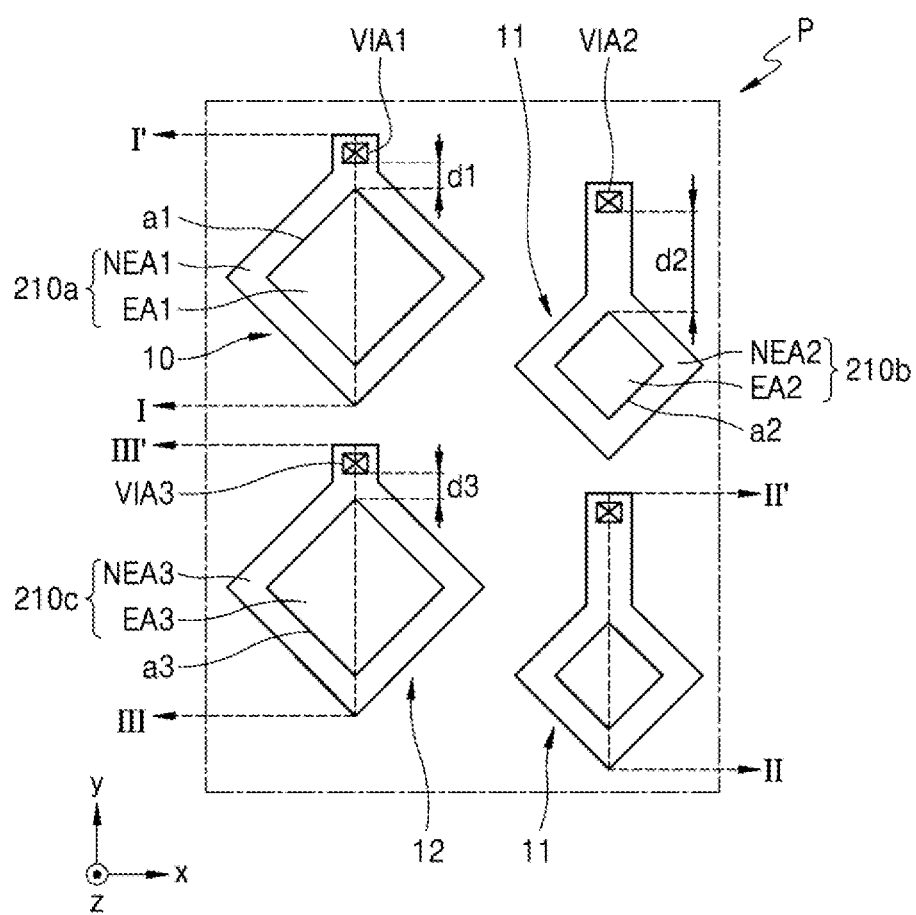
FIG. 6 is a plan view illustrating an arrangement of subpixels according to some exemplary embodiments.
Figure 7:
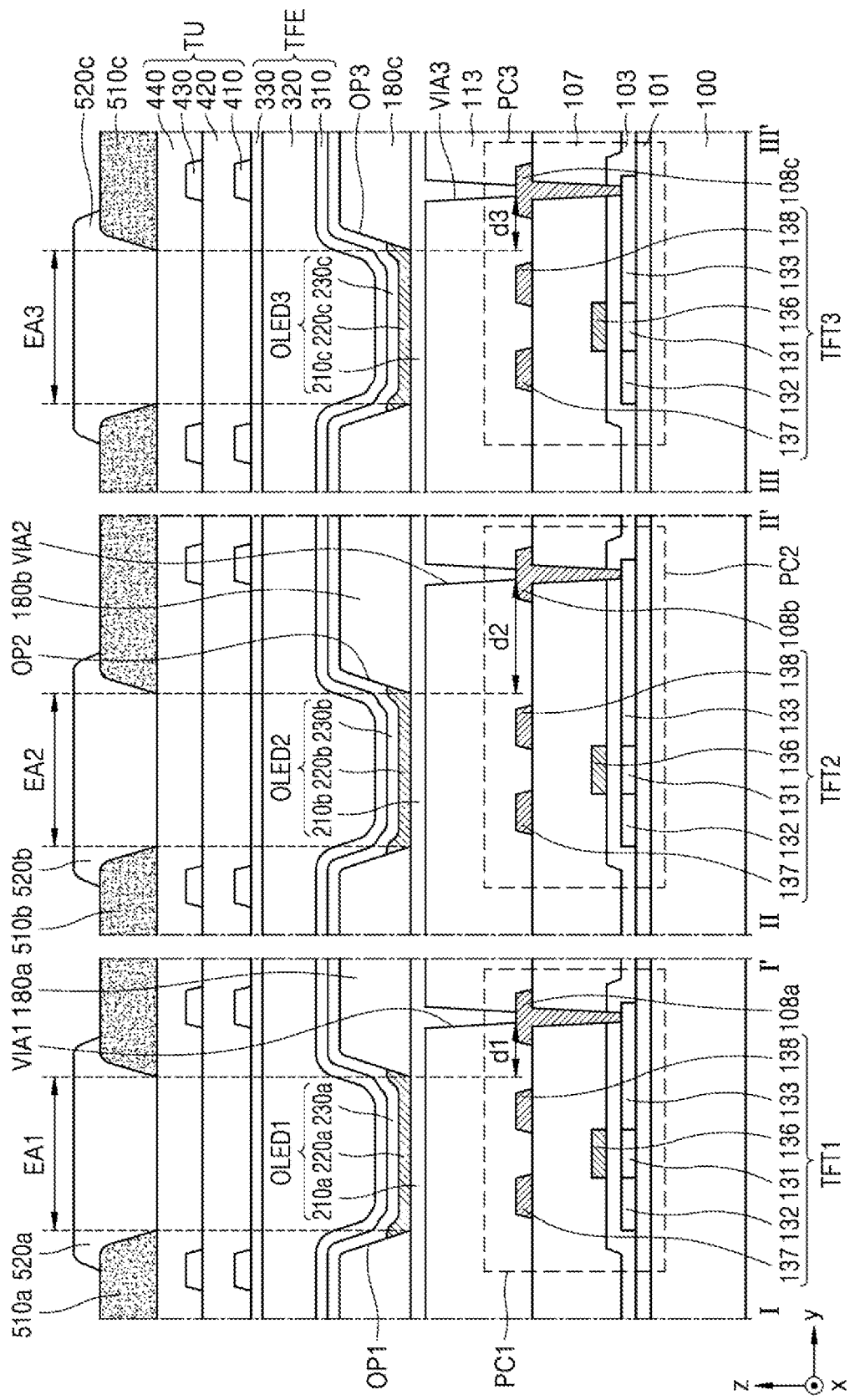
FIG. 7 is a cross-sectional view taken along sectional lines I-I', and of FIG. 6 according to some exemplary embodiments.

FIG. 6 is a plan view illustrating an arrangement of subpixels according to some exemplary embodiments. FIG. 7 is a cross-sectional view taken along sectional lines I-I', II-I-I', and III-III' of FIG. 6 according to some exemplary embodiments. In FIG. 7, sectional line I-I' corresponds to a cross-section taken by cutting a first subpixel 10, sectional line II-II' corresponds to a cross-section taken by cutting a second subpixel 11, and sectional line III-III' corresponds to a cross-section taken by cutting a third subpixel 12. In FIG. 6, the pixel circuit PC (or PC_1) is omitted for convenience of description.

Referring to FIG. 6, a display apparatus according to an exemplary embodiment may include a first subpixel 10, a second subpixel 11, and a third subpixel 12, and more particularly, may include one first subpixel 10, one third subpixel 12, and two second subpixels 11. The first subpixel 10, the second subpixel 11, and the third subpixel 12 may respectively be a blue subpixel Pb, a green subpixel Pg, and a red subpixel Pr.

Referring to FIGS. 6 and 7, a display apparatus according to an embodiment may include a first planarization layer 113 including a first via hole VIA1 and a second via hole VIA2, a first subpixel 10 including a first pixel electrode 210a arranged on the first planarization layer 113 to be electrically connected to a first pixel circuit PC1 through the first via hole VIA1 and including a first emission portion EA1 and a first non-emission portion NEA1 around the first emission portion EA1 and a first pixel definition layer 180a arranged on the first pixel electrode 210a and including a first opening OP1 exposing the first emission portion EA1 of the first pixel electrode 210a, and a second subpixel 11 including a second pixel electrode 210b arranged on the first planarization layer 113 to be electrically connected to a second pixel circuit PC2 through the second via hole VIA2 and including a second emission portion EA2 and a second non-emission portion NEA2 around the second emission portion EA2 and a second pixel definition layer 180b arranged on the second pixel electrode 210b and including a second opening OP2 exposing the second emission portion EA2 of the second pixel electrode 210b. A second distance d2 (defined as the shortest distance from the inner surface of the second opening OP2 to the second via hole VIA2) may be greater than a first distance d1 (defined as the shortest distance from the inner surface of the first opening OP1 to the first via hole VIA1).

In an embodiment, the first planarization layer 113 may further include a third via hole VIA3, and the display apparatus may further include a third subpixel 12 including a third pixel electrode 210c arranged on the first planarization layer 113 to be electrically connected to a third pixel circuit PC3 through the third via hole VIA3 and including a third emission portion EA3 and a third non-emission portion NEA3 around the third emission portion EA3 and a third pixel definition layer 180c arranged on the third pixel electrode 210c and including a third opening OP3 exposing the third emission portion EA3 of the third pixel electrode 210c. A third distance d3 (defined as the shortest distance from the inner surface of the third opening OP3 to the third via hole VIA3) may be less than the second distance d2.

The first emission portion EA1 may have a first area a1, and the second emission portion EA2 may have a second area a2 smaller than the first area a1. Also, the third emission portion EA3 may have a third area a3 greater than the second area a2.

The first via hole VIA1 of the first subpixel 10 and the second via hole VIA2 of the second subpixel 11, and the second via hole VIA2 of the second subpixel 11 and the third via holes VIA3 of the third subpixel 12 may be arranged at different positions in the same row.

Hereinafter, a stacking order of layers of the display apparatus according to an embodiment will be described in more detail with reference to FIG. 7.

A substrate 100 may include at least one of glass and polymer resin; however, embodiments are not limited thereto. The polymer resin may include at least one of polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 including the polymer resin may be flexible, rollable, bendable, and/or twistable. The substrate 100 may have a multilayer structure including an inorganic layer (not illustrated) and a layer including one or more of the above polymer resins.

A buffer layer 101 may be located on the substrate 100 to reduce or block the penetration of foreign materials, moisture, and/or external air from the bottom of the substrate 100 and may provide a flat surface on the substrate 100. The buffer layer 101 may include an inorganic material, such as an oxide or nitride, an organic material, or an organic/inorganic composite, and may include a single-layer or multi-layer structure of an inorganic material and an organic material. A barrier layer (not illustrated) for blocking the penetration of external air may be further included between the substrate 100 and the buffer layer 101.

A first thin film transistor TFT1, a second thin film transistor TFT2, and a third thin film transistor TFT3, and organic light emitting diodes OLED1, OLED2, and OLED3 that are light emitting devices electrically connected to the first thin film transistor TFT1, the second thin film transistor TFT2, and the third thin film transistor TFT3, respectively, may be located over the substrate 100.

The first thin film transistor TFT1, the second thin film transistor TFT2, and the third thin film transistor TFT3 of FIG. 7 may correspond to any one (e.g., the driving thin film transistor T1) of the thin film transistors included in the pixel circuit PC or PC_1 described with reference to FIGS. 4 and 5.

The first thin film transistor TFT1, the second thin film transistor TFT2, and the third thin film transistor TFT3 may include a semiconductor layer and a gate electrode 136. The semiconductor layer may include, for example, polysilicon. The semiconductor layer may include a channel area 131 overlapping the gate electrode 136, and a source area 132 and a drain area 133 arranged at both sides of the channel area 131 and including impurities of a higher concentration than the channel area 131. The impurities may include N-type impurities or P-type impurities. The source area 132 and the drain area 133 may be electrically connected to the source electrode and the drain electrode of the thin film transistor, such as the source electrode and the drain electrode of the first thin film transistor TFT1.

The semiconductor layer may include an oxide semiconductor and/or a silicon semiconductor. When the semiconductor layer includes an oxide semiconductor, the semiconductor layer may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). For example, the semiconductor layer may include InSnZnO (ITZO) or InGaZnO (IGZO). When the semiconductor layer includes a silicon semiconductor, the semiconductor layer may include, for example, amorphous silicon (a-Si) or low temperature poly-silicon (LTPS) crystallized from amorphous silicon (a-Si).

The gate electrode 136 may include a single layer or a multiple layer formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 136 may be connected to a gate line for applying an electrical signal to the gate electrode 136.

A gate insulating layer 103 may be arranged between the semiconductor layer and the gate electrode 136. The gate insulating layer 103 may include, for instance, an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The gate insulating layer 103 may include a single layer or a multiple layer structure including one or more of the above-noted inorganic insulating materials.

An interlayer insulating layer 107 may be arranged on the gate electrode 136. The interlayer insulating layer 107 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), and may include a single layer or a multiple layer structure.

The first thin film transistor TFT1, the second thin film transistor TFT2, and the third thin film transistor TFT3 may include a source electrode 137 connected to the source area 132 of the semiconductor layer, a drain electrode 138 connected to the drain area 133, and first contact electrodes 108a, 108b, and 108c. The source electrode 137 and the drain electrode 138 may be electrically connected to the source area 132 and the drain area 133 of the semiconductor layer through a contact hole passing through the gate insulating layer 103 and the interlayer insulating layer 107.

The first thin film transistor TFT1, the second thin film transistor TFT2, and the third thin film transistor TFT3, and the organic light emitting diodes OLED1, OLED2, and OLED3 may be electrically connected to each other through the first contact electrodes 108a, 108b, and 108c, respectively.

The source electrode 137, the drain electrode 138, and the first contact electrodes 108a, 108b, and 108c may include aluminum (Al), copper (Cu), titanium (Ti), and/or the like, and may include a multiple layer or a single layer structure. For example, the source electrode 137 and the drain electrode 138 may include a multilayer structure, such as Ti/Al/Ti or TiN/Al/Ti.

In an embodiment, to increase the distance between the end of the second pixel definition layer 180b and the second via hole VIA2, the first contact electrode 108b arranged in the second subpixel 11 may be arranged closer to the second non-emission portion NEA2 than the first contact electrode 108a arranged in the first subpixel 10 and the first contact electrode 108c arranged in the third subpixel 12.

In some embodiments, a data line DL (see, e.g., FIG. 4) and a driving voltage line PL (see, e.g., FIG. 4) may be formed of the same material and on the same layer as the source electrode 137, the drain electrode 138, and the first contact electrodes 108a, 108b, and 108c.

The first thin film transistor TFT1, the second thin film transistor TFT2, and the third thin film transistor TFT3 may be covered with a protection layer. The protection layer may prevent a line or the like, which includes a metal, such as aluminum, that may be damaged by an etchant, from being exposed to an etching environment in a display apparatus manufacturing process.

A first planarization layer 113 may be arranged on the interlayer insulating layer 107. The first planarization layer 113 may planarize the upper surface of the first pixel circuit PC1, the second pixel circuit PC2, and the third pixel circuit PC3 to planarize the surface where (or on which) the organic light emitting diodes OLED1, OLED2, and OLED3 will be located.

The first planarization layer 113 may include at least one of a general-purpose polymer, such as at least one of benzocyclobutene (BCB), polyimide, hexamethyldisiloxane (HMDSO), poly(methyl methacrylate) (PMMA), and polystyrene (PS), a polymer derivative having a phenolic group, an acrylic polymer, an imide-based polymer, an arylether-based polymer, an amide-based polymer, a fluorine-based polymer, a p-xylene-based polymer, and a vinyl alcohol-based polymer, or any blend thereof. The first planarization layer 113 may include an inorganic material. The first planarization layer 113 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), and hafnium oxide ($HfO_2$), and zinc oxide ($ZnO_2$). When the first planarization layer 113 includes an inorganic material, chemical planarization polishing may be performed in some cases. In some embodiments, the first planarization layer 113 may include both an organic material and an inorganic material.

The organic light emitting diode OLED1 including a first intermediate layer 220a arranged on the first pixel electrode 210a and a first opposite electrode 230a arranged on the first intermediate layer 220a, the organic light emitting diode OLED2 including a second intermediate layer 220b arranged on the second pixel electrode 210b and a second opposite electrode 230b arranged on the second intermediate layer 220b, and the organic light emitting diode OLED3 including a third intermediate layer 220c arranged on the third pixel electrode 210c and a third opposite electrode 230c arranged on the third intermediate layer 220c may be located on the first planarization layer 113 of the substrate 100.

The first pixel electrode 210a, the second pixel electrode 210b, and the third pixel electrode 210c may be arranged on the first planarization layer 113. The first pixel electrode 210a, the second pixel electrode 210b, and the third pixel electrode 210c may be a transparent or (semitransparent) electrode or a reflective electrode. In some embodiments, the first pixel electrode 210a, the second pixel electrode 210b, and the third pixel electrode 210c may include a reflection layer formed of at least one of Ag, Mg, Al, Pt, Pd, Au, Ni, Nd, Ir, and Cr, or any compound thereof, and a transparent or semitransparent electrode layer formed on the reflection layer. The transparent or semitransparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the first pixel electrode 210a, the second pixel electrode 210b, and the third pixel electrode 210c may be provided in a stack structure of ITO/Ag/ITO.

A first pixel definition layer 180a, a second pixel definition layer 180b, and a third pixel definition layer 180c may be arranged over the first planarization layer 113. The first pixel definition layer 180a, the second pixel definition layer 180b, and the third pixel definition layer 180c may respectively define a first emission portion EA1, a second emission portion EA2, and a third emission portion EA3 by including a first opening OP1 exposing a center (or central) portion of the first pixel electrode 210a, a second opening OP2 exposing a center portion of the second pixel electrode 210b, and a third opening OP3 exposing a center portion of the third pixel electrode 210c. Also, the first to third pixel definition layers 180a, 180b, and 180c may prevent the occurrence of an arc or the like at the edge of the first to third pixel electrodes 210a, 210b, and 210c by increasing the distance between the edge of the first to third pixel electrodes 210a, 210b, and 210c and the first to third opposite electrodes 230a, 230b, and 230c over the first to third pixel electrodes 210a, 210b, and 210c. For example, the first pixel definition layer 180a, the second pixel definition layer 180b, and the third pixel definition layer 180c may be formed of an organic insulating material, such as at least one of polyimide, polyamide, acrylic resin, benzocyclobutene, hexamethyldisiloxane (HMIDSO), and phenol resin by spin coating or the like.

Figure 8:
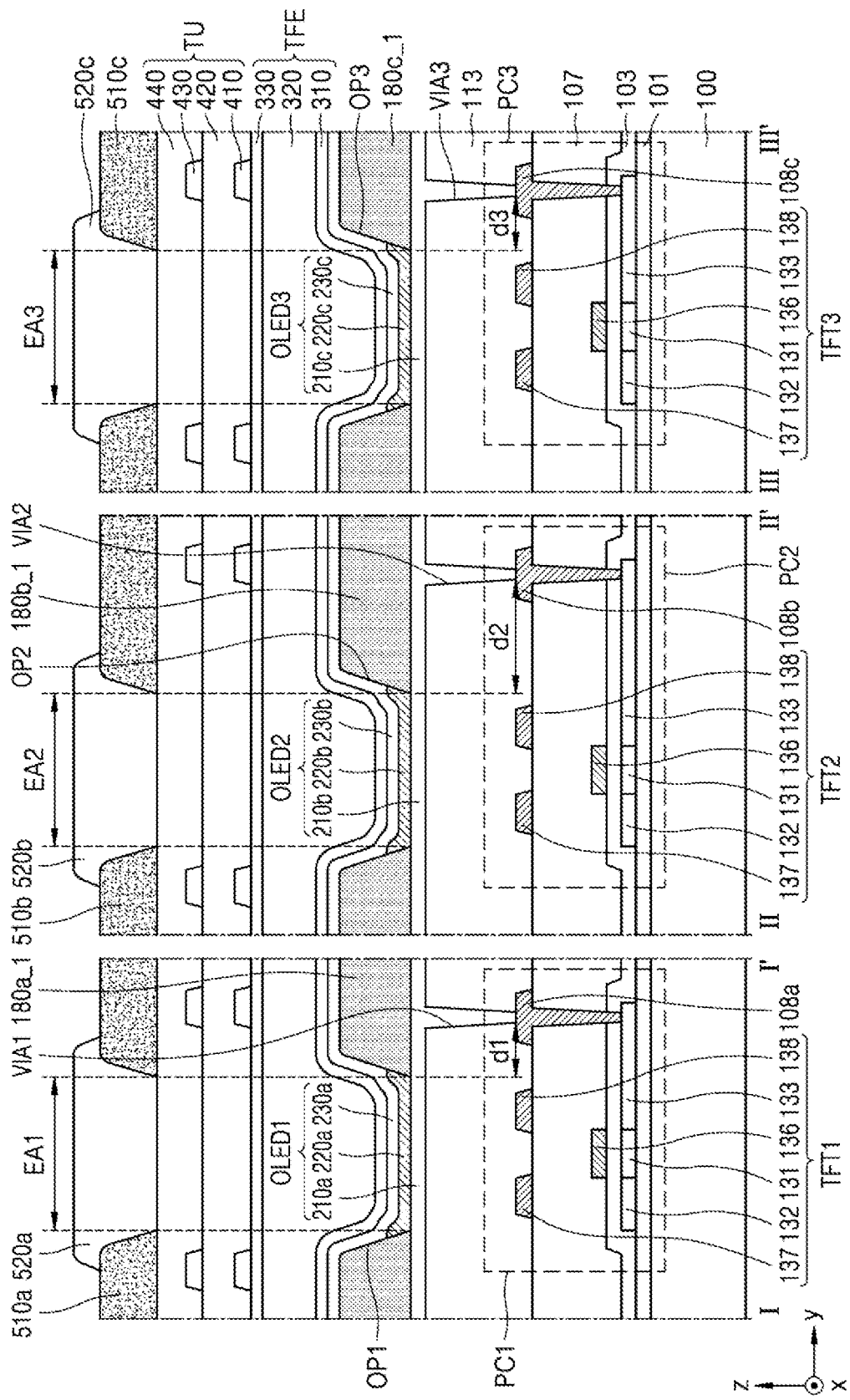
FIG. 8 is a cross-sectional view schematically illustrating a portion of a display apparatus according to some exemplary embodiments.

FIG. 8 is a cross-sectional view schematically illustrating a portion of a display apparatus according to some exemplary embodiments.

As illustrated in FIG. 8, the first pixel definition layer 180a_1, the second pixel definition layer 180b_1, and the third pixel definition layer 180c_1 may include (or define) a black matrix as a light blocking material. The black matrix may include various materials, such as at least one of an organic material mixed with black pigment, chromium (Cr), and chromium oxide ($CrO_x$). When the black matrix is formed of chromium or chromium oxide, the black matrix may include a single layer or a multiple layer structure of chromium and/or chromium oxide. When the first pixel definition layer 180a_1, the second pixel definition layer 180b_1, and the third pixel definition layer 180c_1 include a black matrix, external light reflection may be sufficiently prevented.

A spacer may be arranged on the first pixel definition layer 180a_1, the second pixel definition layer 180b_1, and the third pixel definition layer 180c_1. The spacer may prevent the organic light emitting diodes OLED1, OLED2, and OLED3 from being damaged by the deflection of a mask in a manufacturing process using the mask. For example, the spacer may be formed of an organic insulating material, such as at least one of polyimide, polyamide, acrylic resin, benzocyclobutene, hexamethyldisiloxane (HMDSO), and phenol resin by spin coating or the like, and may include a single layer or a multiple layer structure.

Referring back to FIG. 7, the first intermediate layer 220a may be arranged on the first pixel electrode 210a exposed by the first pixel definition layer 180a, the second intermediate layer 220b may be arranged on the second pixel electrode 210b exposed by the second pixel definition layer 180b, and the third intermediate layer 220c may be arranged on the third pixel electrode 210c exposed by the third pixel definition layer 180c.

The first to third intermediate layers 220a, 220b, and 220c may include an emission layer, and functional layers such as at least one of a hole transport layer (HTL), a hole injection layer (HIL), an electron transport layer (ETL), and an electron injection layer (EIL), may optionally be further included under and over the emission layer.

The emission layer may include an organic material including a fluorescent and/or phosphorescent material emitting red, green, blue, or white light. The emission layer may include a low-molecular weight organic material or a high-molecular weight organic material.

When the emission layer includes a low-molecular weight organic material, the first to third intermediate layers 220a, 220b, and 220c may include a structure in which a hole injection layer (HIL), a hole transport layer (HTL), an emission layer (EML), an electron transport layer (ETL), an electron injection layer (EIL), and the like are stacked in a single or complex structure, and the low-molecular weight organic material may include various organic materials, such as at least one of copper phthalocyanine (CuPc), N,N'-di (naphthalene-1-yl)-N,N'-diphenyl-benzidine(N,N'-Di (napthalene-1-yl)-N,N'-diphenyl-benzidine (NPB), and tris-8-hydroxyquinoline aluminum (Alq3). These layers may be formed by vacuum deposition.

When the emission layer includes a high-molecular weight organic material, the first to third intermediate layers 220a, 220b, and 220c may generally have a structure including a hole transport layer (HTL) and an emission layer (EML). In this case, the hole transport layer may include poly(3,4-ethylenedioxythiophene) (PEDOT) and the emission layer may include a high-molecular weight material, such as at least one of polyphenylene vinylene (PPV) and polyfluorene. The emission layer may be formed by screen printing, inkjet printing, laser induced thermal imaging (LITI), and/or the like.

The first to third pixel electrodes 210a, 210b, and 210c may be provided in plurality, and the first to third intermediate layers 220a, 220b, and 220c may be arranged respectively corresponding to a plurality of first to third pixel electrodes 210a, 210b, and 210c. However, embodiments are not limited thereto. According to some embodiments, the first to third intermediate layers 220a, 220b, and 220c may include, for example, an integral layer over a plurality of first to third pixel electrodes 210a, 210b, and 210c. In an embodiment, the first to third intermediate layers 220a, 220b, and 220c may be arranged respectively corresponding to a plurality of first to third pixel electrodes 210a, 210b, and 210c, and one or more functional layers other than the first to third intermediate layers 220a, 220b, and 220c may be integrally formed over a plurality of first to third pixel electrodes 210a, 210b, and 210c.

In a conventional display apparatus, to improve light extraction efficiency and secure outdoor visibility, a polarizer as a film that may selectively pass or block a vertically or horizontally polarized wave of incident light is located on a touch unit TU; however, when a polarizer is arranged on a touch unit TU, it is difficult to implement a foldable display due to low flexibility. To solve this problem, a method of improving the flexibility by arranging a color filter and a light blocking layer having a polarization function, instead of a polarizer, on a touch unit TU has been devised; however, in the case of a structure in which a light blocking layer and a color filter are arranged on a touch unit TU, the pixel electrode (e.g., the second pixel electrode 210b) on the green subpixel (e.g., the second subpixel 11) is inclined, and thus, a reflective color band occurs in a green subpixel area.

To solve the above-noted problems, according to some embodiments, the occurrence of a green reflective color band may be prevented by improving the flatness of the green subpixel (e.g., the second subpixel 11) by increasing the distance between the via hole (e.g., the second via hole VIA2) of the green subpixel (e.g., the second subpixel 11) and the end of the pixel definition layer (e.g., the second pixel definition layer 180b) in comparison with the blue subpixel (e.g., the first subpixel 10) and the red subpixel (e.g., the third subpixel 12).

As illustrated in FIG. 7, the first via hole VIA1 of the first subpixel 10 may be defined in the first planarization layer 113 at the first distance d1 from the end of the first pixel definition layer 180a, the second via hole VIA2 of the second subpixel 11 may be defined in the first planarization layer 113 at the second distance d2 greater than the first distance d1 from the end of the second pixel definition layer 180b, and the third via hole VIA3 of the third subpixel 12 may be defined in the first planarization layer 113 at the third distance d3 smaller than the second distance d2 from the end of the third pixel definition layer 180c.

The first opposite electrode 230a may be arranged on the first intermediate layer 220a, the second opposite electrode 230b may be arranged on the second intermediate layer 220b, and the third opposite electrode 230c may be arranged on the third intermediate layer 220c. The first to third opposite electrodes 230a, 230b, and 230c may be respectively arranged on the first to third intermediate layers 220a, 220b, and 220c to entirely cover the first to third intermediate layers 220a, 220b, and 220c.

The first to third opposite electrodes 230a, 230b, and 230c may be arranged over the entire surface of the display area DA. In some embodiments, the first to third opposite electrodes 230a, 230b, and 230c may be integrally formed to cover a plurality of pixels.

The first to third opposite electrodes 230a, 230b, and 230c may be transparent electrodes or reflective electrodes. In some embodiments, the first to third opposite electrodes 230a, 230b, and 230c may be transparent or semitransparent electrodes and may include a thin metal layer having a low work function, and may be include at least one of Li, Ca, LiF/Ca, LiF/Al, Al, Ag, and Mg, or any compound thereof. A transparent conductive oxide (TCO) layer, such as at least one of ITO, IZO, ZnO, and $In_2O_3$ may be further arranged on the thin metal layer.

When the first to third pixel electrodes 210a, 210b, and 210c are reflective electrodes and the first to third opposite electrodes 230a, 230b, and 230c are transparent electrodes, the light emitted from the first to third intermediate layers 220a, 220b, and 220c may be emitted toward the first to third opposite electrodes 230a, 230b, and 230c, and thus, the display apparatus 1 may be a top-emission type display apparatus. In an embodiment, when the first to third pixel electrodes 210a, 210b, and 210c are transparent or semitransparent electrodes and the first to third opposite electrodes 230a, 230b, and 230c are reflective electrodes, the light emitted from the first to third intermediate layers 220a, 220b, and 220c may be emitted toward the substrate 100, and thus, the display apparatus 1 may be a bottom-emission type display apparatus. However, embodiments are not limited to the aforementioned examples, and the display apparatus 1 may be a dual-emission type display apparatus that emits light in both directions corresponding to the top side and the bottom side thereof.

A thin film encapsulation layer TFE may be arranged on each of the first to third opposite electrodes 230a, 230b, and 230c to protect the organic light emitting diodes OLED1, OLED2, and OLED3 from external moisture and oxygen. The thin film encapsulation layer TFE may include at least one organic encapsulation layer and at least one inorganic encapsulation layer. For instance, the thin film encapsulation layer TFE may include a first inorganic encapsulation layer 310, a second inorganic encapsulation layer 330 arranged over the first inorganic encapsulation layer 310, and an organic encapsulation layer 320 located between the first inorganic encapsulation layer 310 and the second inorganic encapsulation layer 330.

The first inorganic encapsulation layer 310 and the second inorganic encapsulation layer 330 may include one or more inorganic materials, such as at least one of aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may include a single layer or a multiple layer structure including one or more of the above-noted materials. The first inorganic encapsulation layer 310 and the second inorganic encapsulation layer 330 may include the same material or may include different materials from one another.

The organic encapsulation layer 320 may include at least one of a monomer-based material and a polymer-based material. The organic encapsulation layer 320 may include polyethylene terephthalate, polyethylene naphthalate, polycarbonate, polyimide, polyethylene sulfonate, polyoxymethylene, polyarylate, hexamethyldisiloxane, and acrylic resin (e.g., poly(methyl methacrylate), polyacrylic acid, etc.), or any combination thereof.

A touch unit TU may be directly arranged on the thin film encapsulation layer TFE. For instance, the touch unit TU may be formed directly on the thin film encapsulation layer TFE without the use of an adhesive.

Each touch unit TU may include a first conductive layer 410, a second conductive layer 430 arranged over the first conductive layer 410, a first insulating layer 420 located between the first conductive layer 410 and the second conductive layer 430, and a second insulating layer 440 arranged on the second conductive layer 430. The first conductive layer 410 may include first sensing electrodes, and the second conductive layer 430 may include second sensing electrodes. In an embodiment, the first conductive layer 410 and the second conductive layer 430 may have a mesh shape to prevent (or at least reduce) the recognition by the user and may have a three-layer structure of, for instance, titanium/aluminum/titanium.

The first conductive layer 410 and the second conductive layer 430 may have a single-layer structure or may have a stacked multilayer structure. The single-layer conductive layer may include a metal layer or a transparent conductive layer. The metal layer may include at least one of molybdenum, silver, titanium, copper, and aluminum, or any alloy of at least one of the aforementioned materials. The transparent conductive layer may include a transparent conductive oxide, such as at least one of indium tin oxide (ITO), indium zinc oxide (IZO), zinc oxide (ZnO), and indium tin zinc oxide (ITZO). In some embodiments, the transparent conductive layer may include at least one conductive polymer, such as PEDOT, metal nanowire, graphene, and the like. The multilayer conductive layer may include multilayer metal layers. The multilayer metal layers may have, for example, a three-layer structure of Ti/Al/Ti. The multilayer conductive layer may include at least one metal layer and at least one transparent conductive layer.

Each of the first insulating layer 420 and the second insulating layer 440 may have a single-layer or multilayer structure. Each of the first insulating layer 420 and the second insulating layer 440 may include an inorganic material, an organic material, or a composite material. In some embodiments, at least one of the first insulating layer 420 and the second insulating layer 440 may include an inorganic layer. The inorganic layer may include at least one of aluminum oxide, titanium oxide, silicon oxide, silicon oxynitride, zirconium oxide, and hafnium oxide. In some embodiments, at least one of the first insulating layer 420 and the second insulating layer 440 may include an organic layer. The organic layer may include at least one of acrylic resin, methacryl resin, polyisoprene, vinyl resin, epoxy resin, urethane resin, cellulose resin, siloxane resin, polyimide resin, polyamide resin, and perylene resin.

The touch unit TU may sense an external input, for example, by a capacitive method; however, an operational method of the touch unit TU is not particularly limited, and the touch unit TU according to some embodiments may sense an external input by an electromagnetic induction method, a pressure sensing method, etc.

A color filter layer may be arranged on the touch unit TU. The color filter layer may include a first light blocking layer 510a, a second light blocking layer 510b, and a third light blocking layer 510c, as well as a first color filter 520a, a second color filter 520b, and a third color filter 520c.

The color filter layer may be arranged on each of the first to third subpixels 10, 11, and 12. The first color filter 520a of the color filter layer may be arranged on the first light blocking layer 510a exposing a center portion thereof, the second color filter 520b may be arranged on the second light blocking layer 510b exposing a center portion thereof, and the third color filter 520c may be arranged on the third light blocking layer 510c exposing a center portion thereof. The first light blocking layer 510a may overlap the first pixel definition layer 180a, the second light blocking layer 510b may overlap the second pixel definition layer 180b, and the third light blocking layer 510c may overlap the third pixel definition layer 180c.

The first to third light blocking layers 510a, 510b, and 510c may include various materials, such as at least one of an organic material mixed with black pigment, chromium (Cr), and chromium oxide ($CrO_x$). When the first to third light blocking layers 510a, 510b, and 510c are formed of chromium or chromium oxide, the first to third light blocking layers 510a, 510b, and 510c may include a single layer or a multiple layer structure of chromium or chromium oxide. In an embodiment, the first to third light blocking layers 510a, 510b, and 510c may include the same material.

The first to third color filters 520a, 520b, and 520c may include an organic material pattern including dye and/or pigment. The first color filter 520a may include a blue color filter, the second color filter 520b may include a green color filter, and the third color filter 520c may include a red color filter. The first color filter 520a may be arranged on the first emission portion EA1, the second color filter 520b may be arranged on the second emission portion EA2, and the third color filter 520c may be arranged on the third emission portion EA3. The first color filter 520a may overlap the first pixel electrode 210a, the second color filter 520b may overlap the second pixel electrode 210b, and the third color filter 520c may overlap the third pixel electrode 210c.

A display apparatus according to some embodiments may have improved flexibility by using a light blocking layer and a color filter instead of a polarizer.

Figure 9:
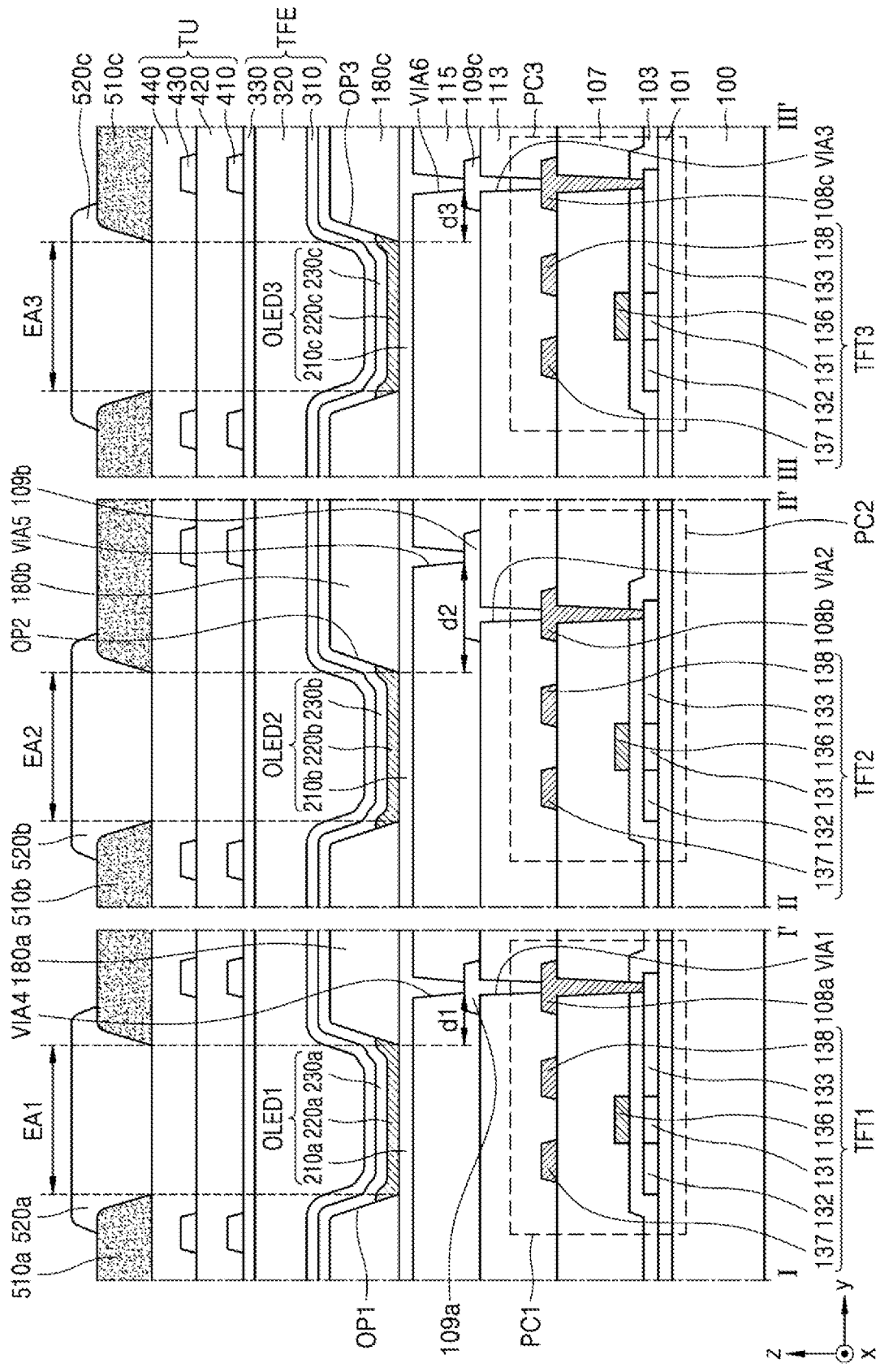
FIG. 9 is a cross-sectional view schematically illustrating a portion of a display apparatus according to some exemplary embodiments.

FIG. 9 is a cross-sectional view schematically illustrating a portion of a display apparatus according to some exemplary embodiments. FIG. 9 is a modified version of the structure illustrated in FIG. 7 in which a difference in the structure exists under an organic light emitting diode. Hereinafter, redundant descriptions will be primarily avoided and differences will be mainly described.

Referring to FIG. 9, a first planarization layer 113 may be arranged on the interlayer insulating layer 107, and a second planarization layer 115 may be arranged on the first planarization layer 113.

The first planarization layer 113 and the second planarization layer 115 may planarize the upper surface of the first to third pixel circuits PC1 to PC3 to planarize the surface where the organic light emitting diodes OLED1, OLED2, and OLED3 will be located.

The first planarization layer 113 and the second planarization layer 115 may include at least one of a general-purpose polymer, such as at least one of benzocyclobutene (BCB), polyimide, hexamethyldisiloxane (HMDSO), polymethylmethacrylate (PMMA), and polystyrene (PS), a polymer derivative having a phenolic group, an acrylic polymer, an imide-based polymer, an arylether-based polymer, an amide-based polymer, a fluorine-based polymer, a p-xylene-based polymer, and a vinyl alcohol-based polymer, or any blend thereof. The first planarization layer 113 and the second planarization layer 115 may include an inorganic material. The first planarization layer 113 and the second planarization layer 115 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). When the first planarization layer 113 and the second planarization layer 115 include an inorganic material, chemical planarization polishing may be performed in some cases. The first planarization layer 113 and the second planarization layer 115 may include both an organic material and an inorganic material.

First contact electrodes 108a, 108b, and 108c may be located between the interlayer insulating layer 107 and the first planarization layer 113, and second contact electrodes 109a, 109b, and 109c may be located between the first planarization layer 113 and the second planarization layer 115.

The first planarization layer 113 may include a first via hole VIA1, a second via hole VIA2, and a third via hole VIA3, and the second planarization layer 115 may include a fourth via hole VIA4, a fifth via hole VIA5, and a sixth via hole VIA6.

A first pixel electrode 210a, a second pixel electrode 210b, and a third pixel electrode 210c may be arranged on the second planarization layer 115. The first pixel electrode 210a may be electrically connected to the first pixel circuit PC1 through the first via hole VIA1 and the fourth via hole VIA4, the second pixel electrode 210b may be electrically connected to the second pixel circuit PC2 through the second via hole VIA2 and the fifth via hole VIA5, and the third pixel electrode 210c may be electrically connected to the third pixel circuit PC3 through the third via hole VIA3 and the sixth via hole VIA6.

The first via hole VIA1 and the fourth via hole VIA4 may be arranged on the same imaginary line (e.g., are concentrically aligned with one another), the second via hole VIA2 and the fifth via hole VIA5 may be spaced apart from each other (e.g., are not concentrically aligned with one another), and the third via hole VIA3 and the sixth via hole VIA6 may be arranged on the same imaginary line (e.g., are concentrically aligned with one another). In an embodiment, the second contact electrode 109b of the second subpixel 11 may extend to one side of the second non-emission portion NEA2 to increase the distance between the end of the second pixel definition layer 180b and the fifth via hole VIA5.

Figure 10:
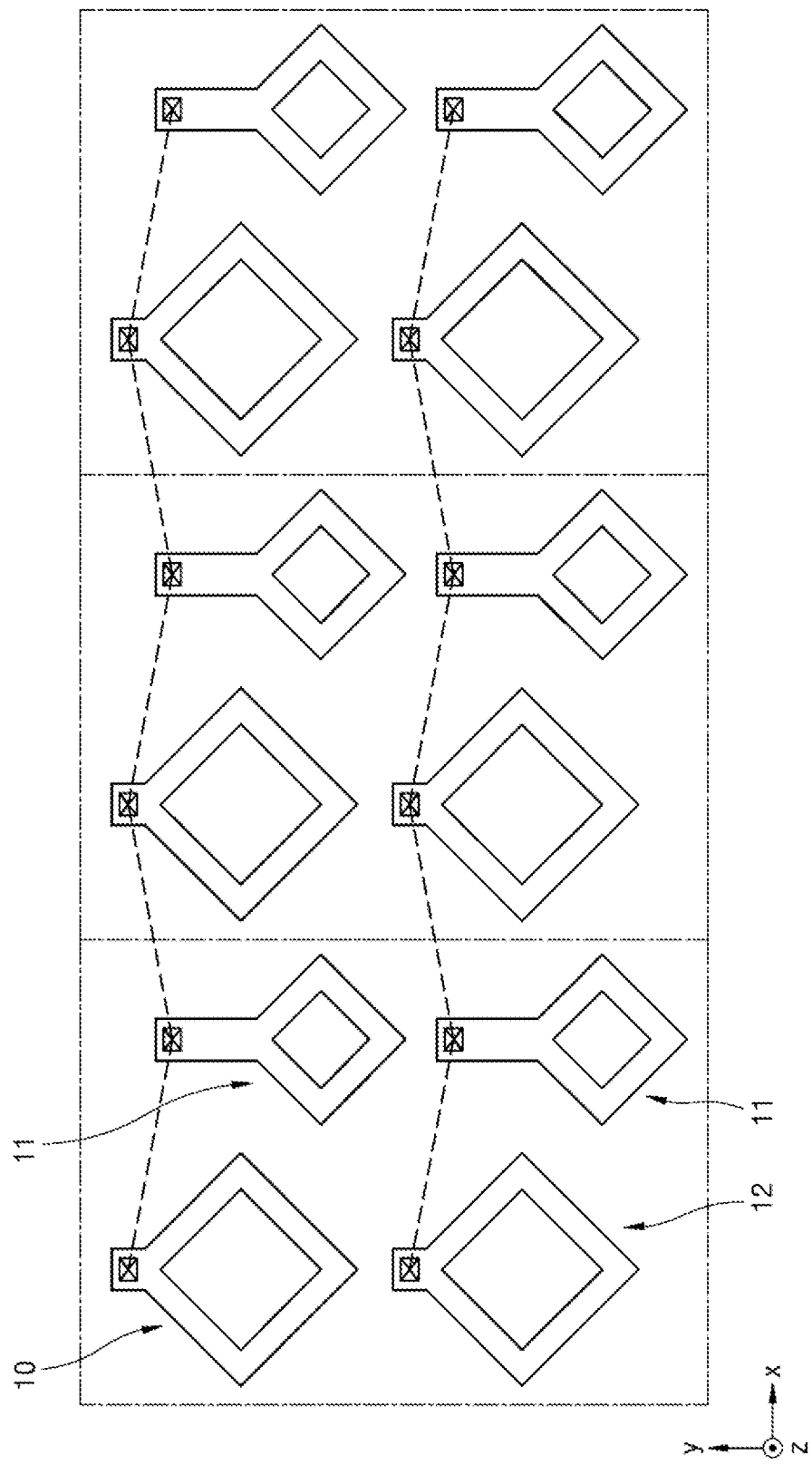
FIG. 10 is a plan view schematically illustrating positions of via holes according to some exemplary embodiments.

FIG. 10 is a plan view schematically illustrating positions of via holes according to some exemplary embodiments.

As illustrated in FIG. 10, as indicated by a dotted line, the first via hole VIA1 of the first subpixel 10, the second via hole VIA2 of the second subpixel 11, and the third via hole VIA3 of the third subpixel 12 may be arranged substantially in a zigzag pattern in the row direction (e.g., the x-direction) on a plane. Also, the fourth via hole VIA4, the fifth via hole VIA5, and the sixth via hole VIA6 may be arranged substantially in a zigzag pattern in the row direction on a plane.

A display apparatus according to an embodiment may include: a substrate 100 including a first emission portion EA1, a second emission portion EA2, and a third emission portion EA3; a first planarization layer 113 arranged over the substrate 100 and including a first via hole VIA1, a second via hole VIA2, and a third via hole VIA3, a first pixel electrode 210a arranged on the first planarization layer 113 and electrically connected to a first pixel circuit PC1 through the first via hole VIA1; a second pixel electrode 210b arranged on the first planarization layer 113 and electrically connected to a second pixel circuit PC2 through the second via hole VIA2; a third pixel electrode 210c arranged on the first planarization layer 113 and electrically connected to a third pixel circuit PC3 through the third via hole VIA3; first to third pixel definition layers 180a, 180b, and 180c arranged on the first pixel electrode 210a, the second pixel electrode 210b, and the third pixel electrode 210c and including a first opening OP1 exposing a center portion of the first pixel electrode 210a, a second opening OP2 exposing a center portion of the second pixel electrode 210b, and a third opening OP3 exposing a center portion of the third pixel electrode 210c; a first intermediate layer 220a arranged on the first pixel electrode 210a; a second intermediate layer 220b arranged on the second pixel electrode 210b; a third intermediate layer 220c arranged on the third pixel electrode 210c; and opposite electrodes 230a, 230b, and 230c arranged on the first intermediate layer 220a, the second intermediate layer 220b, and the third intermediate layer 220c. In this manner, a second distance d2 defined as the shortest distance from the inner surface of the second opening OP2 to the second via hole VIA2 may be greater than a first distance d1 defined as the shortest distance from the inner surface of the first opening OP1 to the first via hole VIA1, and a third distance d3 defined as the shortest distance from the inner surface of the third opening OP3 to the third via hole VIA3 may be less than the second distance d2.

The display apparatus may further include a second planarization layer 115 arranged on the first planarization layer 113, and the second planarization layer 115 may include a fourth via hole VIA4, a fifth via hole VIA5, and a sixth via hole VIA6.

The first via hole VIA1, the second via hole VIA2, and the third via hole VIA3 may be arranged in a zigzag pattern on a plane, and the fourth via hole VIA4, the fifth via hole VIA5, and the sixth via hole VIA6 may be arranged in a zigzag pattern on a plane.

A color filter layer may be further arranged over the opposite electrodes 230a, 230b, and 230c. The color filter layer may include a first light blocking layer 510a, a second light blocking layer 510b, and a third light blocking layer 510c, as well as include a first color filter 520a, a second color filter 520b, and a third color filter 520c.

According to some exemplary embodiments, to solve a problem of the occurrence of a green reflective color band in the case of a conventional structure using a color filter and a light blocking layer having a polarization function in a display apparatus, a display apparatus may be configured to increase the distance between the via hole of a green subpixel and the end of a pixel definition layer in comparison with a blue subpixel and a red subpixel to improve the flatness of the green subpixel. In this manner, it may be possible to provide a display apparatus that has improved reliability while preventing the occurrence of a green reflective color band.

Although only the display apparatus has been mainly described above, embodiments are not limited thereto. For example, a method of manufacturing the display apparatus is also within the scope of the present disclosure.

According to some embodiments, by increasing the distance between the via hole of a green subpixel and the end of a pixel definition layer in comparison with a blue subpixel and a red subpixel to improve the flatness of the green subpixel, it may be possible to implement a display apparatus that has improved reliability while preventing the occurrence of a green reflective color band. However, the scope of the present disclosure is not limited to these effects.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display apparatus comprising:
a first planarization layer comprising a first via hole and a second via hole;
a first subpixel comprising a first pixel electrode and a first pixel definition layer,
wherein the first pixel electrode is arranged on the first planarization layer, and is electrically connected to a first pixel circuit through the first via hole, and
wherein the first pixel definition layer is arranged on and exposes a first area of the first pixel electrode;
a second subpixel comprising a second pixel electrode and a second pixel definition layer,
wherein the second pixel electrode is arranged on the first planarization layer, and is electrically connected to a second pixel circuit through the second via hole, and
wherein the second pixel definition layer is arranged on and exposes a second area of the second pixel electrode, the second area being smaller than the first area;
a first light blocking layer comprising a first opening overlapping the first pixel electrode;
a second light blocking layer comprising a second opening overlapping the second pixel electrode;
a first color filter overlapping the first opening; and
a second color filter overlapping the second opening,
wherein a second distance defined as a shortest distance from an inner surface of the second opening to the second via hole is greater than a first distance defined as a shortest distance from an inner surface of the first opening to the first via hole.

2. The display apparatus of claim 1, wherein:
the first planarization layer further comprises a third via hole, and
the display apparatus further comprising:
a third subpixel comprising a third pixel electrode and a third pixel definition layer.

3. The display apparatus of claim 2, wherein:
the third pixel electrode is arranged on the first planarization layer, and is electrically connected to a third pixel circuit through the third via hole, and the third pixel definition layer is arranged on the third pixel electrode.

4. The display apparatus of claim 3, further comprising:
a third light blocking layer comprising a third opening overlapping the third pixel electrode; and
a third color filter overlapping the third opening;
wherein a third distance defined as a shortest distance from an inner surface of the third opening to the third via hole is less than the second distance.

5. The display apparatus of claim 3, wherein the first via hole, the second via hole, and the third via hole are arranged in zigzag pattern on a plane.

6. The display apparatus of claim 3, wherein:
the first pixel electrode further comprises a first emission portion and a first non-emission portion around the first emission portion;
the second pixel electrode further comprises a second emission portion and a second non-emission portion around the second emission portion; and
the third pixel electrode further comprises a third emission portion and a third non-emission portion around the third emission portion.

7. The display apparatus of claim 6, wherein:
the first pixel definition layer further comprises a fourth opening exposing a portion of the first pixel electrode corresponding to the first emission portion,
the second pixel definition layer further comprises a fifth opening exposing a portion of the second pixel electrode corresponding to the second emission portion, and
the third pixel definition layer further comprises a sixth opening exposing a portion of the third pixel electrode corresponding to the third emission portion.

8. The display apparatus of claim 7, wherein:
the first subpixel further comprises a first intermediate layer arranged on the portion of the first pixel electrode exposed by the fourth opening and a first opposite electrode arranged on the first intermediate layer;
the second subpixel further comprises a second intermediate layer arranged on the portion of the second pixel electrode exposed by the fifth opening and a second opposite electrode arranged on the second intermediate layer; and
the third subpixel further comprises a third intermediate layer arranged on the portion of the third pixel electrode exposed by the sixth opening and a third opposite electrode arranged on the third intermediate layer.

9. The display apparatus of claim 8, further comprising:
a thin film encapsulation layer arranged on the first opposite electrode, the second opposite electrode, and the third opposite electrode, the thin film encapsulation layer comprising at least one inorganic encapsulation layer and at least one organic encapsulation layer.

10. The display apparatus of claim 9, further comprising:
a touch unit arranged directly on the thin film encapsulation layer,
wherein the touch unit comprises:
a first conductive layer;
a second conductive layer arranged over the first conductive layer;
a first insulating layer arranged between the first conductive layer and the second conductive layer; and
a second insulating layer arranged on the second conductive layer.

11. The display apparatus of claim 7, wherein:
the first color filter is arranged over the first emission portion, the second color filter is arranged over the second emission portion, and
the third color filter is arranged over the third emission portion.

12. The display apparatus of claim 2, wherein each of the first pixel definition layer, the second pixel definition layer, and the third pixel definition layer comprises a light blocking material.

13. The display apparatus of claim 2, further comprising:
an interlayer insulating layer;
a first contact electrode arranged on the interlayer insulating layer;
a second planarization layer arranged on the first contact electrode and comprising a fourth via hole, a fifth via hole, and a sixth via hole; and
a second contact electrode arranged between the first planarization layer and the second planarization layer.

14. The display apparatus of claim 13, wherein:
the first pixel electrode is electrically connected to the first pixel circuit through the first via hole and the fourth via hole,
the second pixel electrode is electrically connected to the second pixel circuit through the second via hole and the fifth via hole, and
the third pixel electrode is electrically connected to the third pixel circuit through the third via hole and the sixth via hole.

15. The display apparatus of claim 1, wherein:
the first opening exposes and coincides with the first area, and
the second opening exposes and coincides with the second area.

16. The display apparatus of claim 4, wherein:
the first subpixel is a blue subpixel,
the second subpixel is a green subpixel, and
the third subpixel is a red subpixel.

17. A display apparatus comprising:
a first planarization layer comprising a first via hole and a second via hole;
a first subpixel comprising a first pixel electrode and a first pixel definition layer,
wherein the first pixel electrode is arranged on the first planarization layer, is electrically connected to a first pixel circuit through the first via hole, and
wherein the first pixel definition layer is arranged on the first pixel electrode;
a second subpixel comprising a second pixel electrode and a second pixel definition layer,
wherein the second pixel electrode is arranged on the first planarization layer, and is electrically connected to a second pixel circuit through the second via hole, and
wherein the second pixel definition layer is arranged on the second pixel electrode;
an interlayer insulating layer;
a first contact electrode arranged on the interlayer insulating layer;
a second planarization layer arranged on the first contact electrode and comprising a fourth via hole, a fifth via hole, and a sixth via hole; and
a second contact electrode arranged between the first planarization layer and the second planarization layer,
a first light blocking layer comprising a first opening overlapping the first pixel electrode;
a second light blocking layer comprising a second opening overlapping the second pixel electrode;
a first color filter overlapping the first opening; and a second color filter overlapping the second opening;
wherein a second distance defined as a shortest distance from an inner surface of the second opening to the second via hole is greater than a first distance defined as a shortest distance from an inner surface of the first opening to the first via hole,
wherein, in a plan view:
the first via hole and the fourth via hole are located on a same imaginary line, and
the second via hole and the fifth via hole are spaced apart from each other.

18. The display apparatus of claim 17, wherein:
the first planarization layer further comprises a third via hole, and
a third subpixel comprising a third pixel electrode and a third pixel definition layer.

19. The display apparatus of claim 18, wherein:
the third pixel electrode is arranged on the first planarization layer, and is electrically connected to a third pixel circuit through the third via hole, and
the third pixel definition layer is arranged on the third pixel electrode.

20. The display apparatus of claim 19, further comprising:
a third light blocking layer comprising a third opening overlapping the third pixel electrode; and
a third color filter overlapping the third opening,
wherein a third distance defined as a shortest distance from an inner surface of the third opening to the third via hole is less than the second distance.

\* \* \* \* \*